United States Patent
Bonardi et al.

(10) Patent No.: US 6,657,767 B2
(45) Date of Patent: Dec. 2, 2003

(54) REARVIEW MIRROR ASSEMBLY CONSTRUCTION

(75) Inventors: Timothy A. Bonardi, Buchanan, MI (US); Frederick T. Bauer, Holland, MI (US)

(73) Assignee: Gentex Corporation, Zeeland, MI (US)

(*) Notice: Subject to any disclaimer, the term of this patent is extended or adjusted under 35 U.S.C. 154(b) by 0 days.

(21) Appl. No.: 10/105,574

(22) Filed: Mar. 25, 2002

(65) Prior Publication Data

US 2002/0171954 A1 Nov. 21, 2002

Related U.S. Application Data

(63) Continuation-in-part of application No. 09/862,414, filed on May 21, 2001.

(51) Int. Cl.[7] ............ G02F 1/15; F21V 21/00; B60Q 1/26
(52) U.S. Cl. ............ 359/265; 359/267; 359/589; 359/839; 362/545; 362/540; 362/503; 362/249; 362/494; 362/488
(58) Field of Search ............ 359/265, 267, 359/589, 839, 877; 362/545, 540, 503, 249, 494, 495, 497, 485, 487, 488; 348/148, 152

(56) References Cited

U.S. PATENT DOCUMENTS

| | | | |
|---|---|---|---|
| 1,096,452 A | 5/1914 | Perrin | |
| 1,563,258 A | 11/1925 | Cunningham | |
| 2,457,348 A | 12/1948 | Chambers | |
| 2,561,582 A | 7/1951 | Marbel | |
| 4,274,078 A | 6/1981 | Isobe et al. | |
| 4,733,335 A | * 3/1988 | Serizawa et al. | 362/503 |
| 4,803,599 A | 2/1989 | Trine et al. | 362/249 |
| 5,014,167 A | 5/1991 | Roberts | |
| 5,016,996 A | 5/1991 | Ueno | |
| 5,017,903 A | 5/1991 | Krippelz, Sr. | |
| 5,059,015 A | 10/1991 | Tran | |
| 5,151,824 A | 9/1992 | O'Farrell et al. | |
| 5,207,492 A | 5/1993 | Roberts | |
| 5,313,335 A | 5/1994 | Gray et al. | |
| 5,355,284 A | 10/1994 | Roberts | |
| 5,361,190 A | 11/1994 | Roberts et al. | |
| 5,371,659 A | 12/1994 | Pastrick et al. | |
| 5,402,103 A | 3/1995 | Tashiro | |

(List continued on next page.)

FOREIGN PATENT DOCUMENTS

| | | |
|---|---|---|
| CA | 2028461 | 11/1994 |
| EP | 0450162 | 12/1990 |
| GB | 2161440 | 1/1986 |
| WO | 0030893 | 6/2000 |

OTHER PUBLICATIONS

Roberts, John K., "Dichroic Mirrors with Semi–active Covert Displays—New Tools for Vehicle Safety," a reprint from the proceedings of Interior & Exterior Systems, International Body Engineering Conference, Sep. 21–23, 1993, Detroit, Michigan.

*Primary Examiner*—Loha Ben
(74) *Attorney, Agent, or Firm*—Price, Heneveld, Cooper, DeWitt & Litton

(57) ABSTRACT

A rearview mirror assembly of the present invention includes a circuit board disposed behind the mirror. The circuit board may be a flexible circuit board and may include an LED mounted to project light through a transparent window in the flexible circuit board and through the mirror. The flexible circuit board may function as a mirror heater and may include conductive paths for connection to the LED and/or electrodes of an electrochromic mirror. The LED may include an LED chip mounted directly on the circuit board and encapsulated thereon by an encapsulant.

66 Claims, 11 Drawing Sheets

U.S. PATENT DOCUMENTS

| | | |
|---|---|---|
| 5,436,741 A | 7/1995 | Crandall |
| D363,920 S | 11/1995 | Roberts et al. |
| 5,481,409 A | 1/1996 | Roberts |
| 5,497,305 A | 3/1996 | Pastrick et al. |
| 5,497,306 A | 3/1996 | Pastrick |
| 5,528,422 A | 6/1996 | Roberts |
| 5,587,699 A | 12/1996 | Faloon et al. |
| 5,619,374 A | 4/1997 | Roberts |
| 5,619,375 A | 4/1997 | Roberts |
| 5,632,551 A * | 5/1997 | Roney et al. ............... 362/249 |
| 5,669,699 A | 9/1997 | Pastrick et al. |
| 5,669,704 A | 9/1997 | Pastrick |
| 5,669,705 A | 9/1997 | Pastrick et al. |
| D394,833 S | 6/1998 | Muth |
| 5,788,357 A | 8/1998 | Muth et al. |
| 5,796,176 A | 8/1998 | Kramer et al. |
| 5,798,575 A | 8/1998 | O'Farrell et al. |
| 5,818,625 A | 10/1998 | Forgette et al. |
| 5,823,654 A | 10/1998 | Pastrick et al. |
| 5,825,527 A | 10/1998 | Forgette et al. |
| 5,863,116 A | 1/1999 | Pastrick et al. |
| 5,879,074 A | 3/1999 | Pastrick |
| D409,540 S | 5/1999 | Muth |
| 5,938,320 A | 8/1999 | Crandall |
| 5,959,367 A | 9/1999 | O'Farrell et al. |
| 6,005,724 A | 12/1999 | Todd |
| 6,007,222 A | 12/1999 | Thau |
| 6,045,243 A | 4/2000 | Muth et al. |
| D425,466 S | 5/2000 | Todd et al. |
| 6,064,508 A | 5/2000 | Forgette et al. |
| D426,506 S | 6/2000 | Todd et al. |
| D426,507 S | 6/2000 | Todd et al. |
| D427,128 S | 6/2000 | Mathieu |
| 6,074,077 A | 6/2000 | Pastrick et al. |
| 6,076,948 A | 6/2000 | Bukosky et al. |
| D428,372 S | 7/2000 | Todd et al. |
| D428,373 S | 7/2000 | Todd et al. |
| 6,086,229 A | 7/2000 | Pastrick |
| 6,093,976 A | 7/2000 | Kramer et al. |
| D428,842 S | 8/2000 | Todd et al. |
| D429,202 S | 8/2000 | Todd et al. |
| D430,088 S | 8/2000 | Todd et al. |
| 6,099,155 A | 8/2000 | Pastrick et al. |
| 6,111,683 A | 8/2000 | Cammenga et al. |
| 6,111,684 A | 8/2000 | Forgette et al. |
| 6,124,886 A | 9/2000 | DeLine et al. |
| 6,142,656 A | 11/2000 | Kurth |
| 6,146,003 A | 11/2000 | Thau |
| 6,149,287 A | 11/2000 | Pastrick et al. |
| 6,152,590 A * | 11/2000 | Furst et al. ............... 362/545 |
| 6,163,083 A | 12/2000 | Kramer et al. |
| 6,166,848 A | 12/2000 | Cammenga et al. |
| 6,175,164 B1 | 1/2001 | O'Farrell et al. |
| 6,176,602 B1 | 1/2001 | Pastrick et al. |
| 6,195,194 B1 | 2/2001 | Roberts et al. |
| 6,206,533 B1 | 3/2001 | Shi |
| 6,206,553 B1 * | 3/2001 | Boddy et al. ............... 362/494 |
| 6,227,689 B1 | 5/2001 | Miller |
| 6,244,716 B1 | 6/2001 | Steenwyk et al. |
| 6,257,746 B1 | 7/2001 | Todd et al. |
| 6,264,353 B1 | 7/2001 | Carraher et al. |
| 6,276,821 B1 | 8/2001 | Pastrick et al. |
| 6,280,069 B1 | 8/2001 | Pastrick et al. |
| 6,296,379 B1 | 10/2001 | Pastrick |
| 6,299,333 B1 | 10/2001 | Pastrick et al. |
| 6,336,737 B1 | 1/2002 | Thau |
| 6,340,849 B1 | 1/2002 | Kramer et al. |
| 6,347,880 B1 | 2/2002 | Furst et al. |
| 6,356,376 B1 | 3/2002 | Tonar et al. |
| 6,416,208 B2 | 7/2002 | Pastrick et al. |
| 6,441,943 B1 | 8/2002 | Roberts et al. |
| 6,340,850 B2 | 11/2002 | O'Farrell et al. |
| 2002/0126497 A1 | 9/2002 | Pastrick |

* cited by examiner

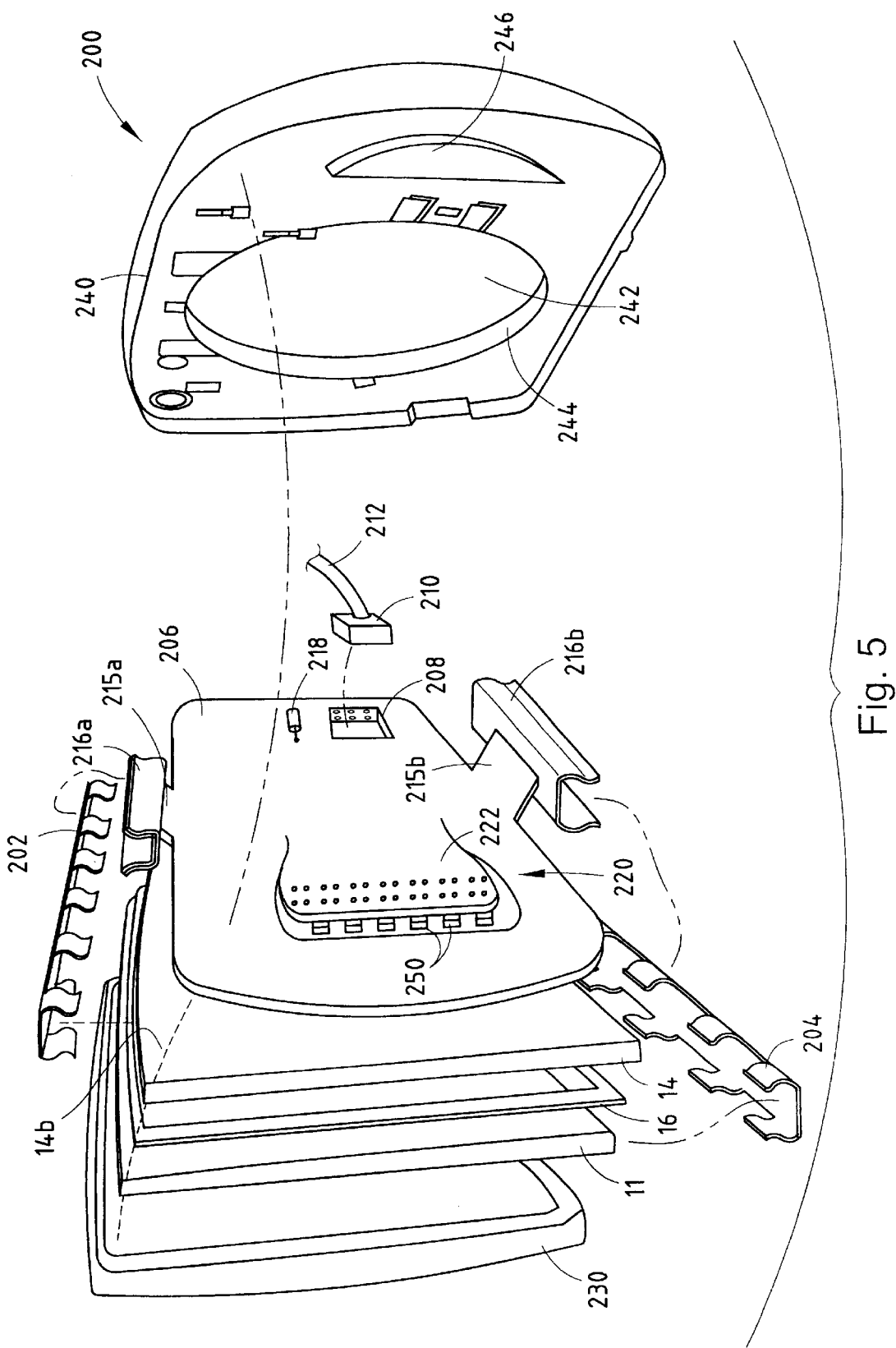

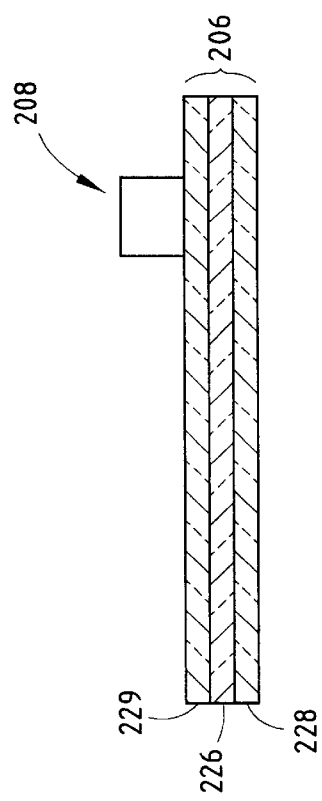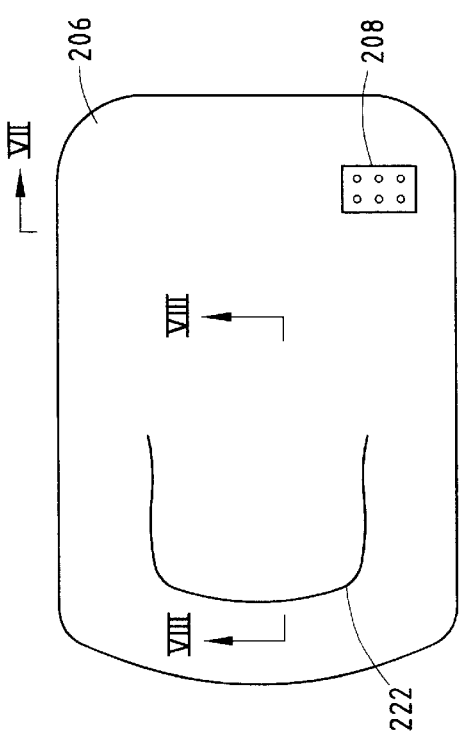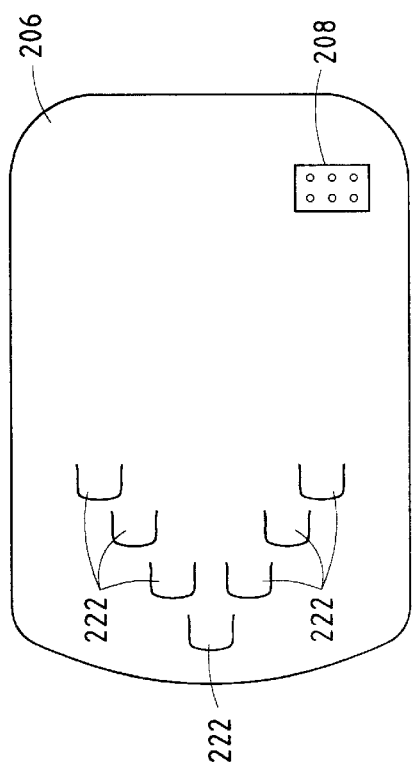

REARVIEW MIRROR ASSEMBLY CONSTRUCTION

CROSS-REFERENCE TO RELATED APPLICATIONS

This application is a continuation-in-part of U.S. patent application Ser. No. 09/862,414 entitled "REARVIEW MIRROR CONSTRUCTED FOR EFFICIENT ASSEMBLY," filed on May 21, 2001 by Bradley L. Busscher et al., the entire disclosure of which is incorporated herein by reference.

BACKGROUND OF THE INVENTION

The present invention generally relates to a rearview mirror assembly for a vehicle. More particularly, the present invention relates to a rearview mirror assembly having a turn indicator incorporated therein and/or a flexible circuit board. The invention also pertains to subassemblies for use in a rearview mirror assembly in which an LED is mounted to a circuit board in a novel manner.

Outside rearview mirror assemblies incorporating turn signal indicators have become increasingly popular. An example of one significant advantage that can be achieved by such a "signal mirror" is evident from FIG. 1, wherein vehicle A includes an outside signal mirror assembly 100. The driver of vehicle B is positioned in what is commonly referred to as the blindspot for the driver of vehicle A. Additionally, the driver of vehicle B is unlikely to see the rear turn signal lamp 102 of vehicle A being well outside the optimum viewing area D for that signal lamp. A signal indicator that generates a signal discernable in viewing area C is therefore advantageous as the driver of vehicle B can be alerted to the intent of the driver of vehicle A to change lanes, and can take appropriate action to avoid an accident in response to the viewing of the turn signal indication.

Signal mirrors generally employ one or more lamps in a mirror assembly to generate a turn indication signal. More specifically, outside signal mirrors have employed a lamp assembly positioned either behind the mirror, such that the signal light passes through the mirror, or on the rearview mirror housing, such that the signal lamp is independent of the mirror and projects light from a position either adjacent to or outside the periphery of the rearview mirror. Examples of rearview mirror assemblies incorporating turn signal indicators or other light modules positioned adjacent a rearview mirror are disclosed in U.S. Pat. Nos. 5,059,015; 5,402,103; 5,490,049; 5,497,306; 5,669,704; 5,669,705; 5,823,654; 5,863,116; 6,007,222; 6,049,271; 6,086,229; 6,119,031; 6,152,590; and 6,176,602. Rearview mirror assemblies incorporating a turn signal indicator that is directed forward of the mirror housing and subsequently directed rearward by appropriate light piping is also known in the prior art. Examples of rearview mirror assemblies where a light module is disposed behind the mirror are disclosed in U.S. Pat. Nos. D 363,920; D 394,833; D 409,540; D 425,466; D 426,506; D 426,507; D 428,372; D 428,373; D 428,842; D 429,202; D 430,088; 5,014,167; 5,207,492; 5,313,335; 5,355,284; 5,361,190; 5,436,741; 5,481,409; 5,528,422; 5,587,699; 5,619,374; 5,619,375; 5,788,537; 5,938,320; 6,005,724; 6,045,243; 6,076,948; 6,111,684; 6,142,656; 6,166,848; and 6,257,746.

FIG. 2 illustrates one example of a light module mounted behind a mirror, which happens to be an electrochromic mirror. As illustrated, rearview mirror assembly 100 includes a mirror 10, which is movably mounted within a housing 12. Housing 12 includes a mounting foot or bracket 14 for mounting the assembly to a vehicle. Mirror assembly 100 may be fixedly mounted to the outside of the vehicle or may be pivotally mounted to allow for folding of the mirror assembly. Mirror assembly 100 further includes a turn signal indicator 20 disposed behind mirror 10. The detailed construction of turn signal indicator 20 is shown in FIGS. 3 and 4 and discussed further below. As shown in FIG. 2, turn signal indicator 20 includes a plurality of light sources each disposed behind regions 22 of mirror 10 that are at least partially transmissive. These partially transmissive regions 22 may be provided in a variety of ways by either etching the reflector of mirror 10 in those regions completely or partially etching portions of the regions 22 as disclosed in commonly assigned U.S. Pat. No. 6,111,683. Alternatively, regions 22 may be formed as partially transmissive, partially reflective regions of mirror 10 or else the entire mirror 10 may include a partially transmissive, partially reflective reflector as disclosed in commonly assigned U.S. Pat. No. 6,166,848.

As shown in FIG. 3, turn signal indicator 20 may further include a sensor 56 provided to sense ambient light levels so that an associated circuit 58 may attenuate the light levels emitted by the lamps (i.e., LEDs 54). This sensor 56 may be disposed behind a region 24 (FIG. 2) that is at least partially transmissive and is similar in construction to partially transmissive regions 22 associated with the LEDs 54. As shown in FIGS. 3 and 4, LEDs 54 are mounted to a circuit board 50 that is generally parallel to the rear surface 14b of the electrochromic mirror 10. Circuit board 50 is mounted within a light module housing 52 that is secured or otherwise disposed behind the rear surface of mirror 10. As best shown in FIG. 4, LEDs 54 are typically mounted to circuit board 50 with their optical axes inclined at an angle relative to circuit board 50 so as to project light to the side and rear of the rearview mirror assembly but not back at the eyes of the driver so as to not distract the driver.

Referring back to FIG. 2, turn signal indicator 20 is electrically coupled to a turn signal actuator 26 provided in the vehicle via one or more electrical wires or cables 28. The electrochromic mirror may be connected in a variety of ways via one or more wires or cables 36 to an inside mirror control circuit 30, which in turn is coupled to an ambient light sensor 32 and a glare light sensor 34 so as to adjust the reflectivity of both the inside and outside rearview mirrors based upon ambient light levels and glare levels of light sources located to the rear of the vehicle. An ambient light level signal may also be transmitted via a wire or cable 38 from inside mirror control circuit 30 to a variable attenuator 60 provided in the rearview mirror assembly or elsewhere in the vehicle. Variable attenuator 60 may thus be provided in addition or in lieu of sensor 56 so as to attenuate the light levels of LEDs 54 in response to ambient light sensed by a sensor remote from the outside rearview mirror housing.

The rearview mirror housing may further include a mirror position actuator (not shown), which is mounted to the inside of housing 12 and attached to the rear of mirror 10 via a carrier plate (not shown). The mirror position actuator may be electrically coupled to a mirror position controller 44 located within the vehicle via one or more electrical wires or cables 46. In this manner, the positioning of mirror 10 within housing 12 may be adjusted remotely within the cabin of the vehicle using an appropriate switch or other user input mechanism.

Additionally, rearview mirror assembly 100 may include a heater circuit provided on the rear of mirror 10 so as to heat the mirror to remove moisture such as snow, frost, or mist from the surface of mirror 10 to thereby allow clear viewing by the driver. Such a heater may be electrically coupled to a heater control circuit 40 via one or more wires or cables 42. The heater control circuit 40 may be incorporated within the vehicle climate control system such that the heater is activated whenever a window defroster/defogger is activated.

Some details of the structure shown in FIG. 4 are described further below. Additional details are disclosed in U.S. Pat. No. 6,166,848, the entire disclosure of which is incorporated herein by reference.

Of significance with respect to FIG. 4 is the fact that the LEDs 54 are mounted at an angle relative to circuit board 50. Mounting LEDs at the appropriate angle is difficult using conventional electronic component placement equipment. In general, circuit board 50 is constructed with two vias per LED 54 for receipt of two of the four LED leads. To mount the LEDs on circuit board 50, two of the leads are inserted in the two corresponding vias while the other two leads abut the same surface of circuit board 50 on which LED 54 is otherwise located. The LED leads passing through the vias are then soldered on the opposite side of circuit board 50 to make the appropriate connections and to secure LEDs 54 to circuit board 50. One problem with this approach is that two of the leads of each LED 54 are not secured firmly to circuit board 50, and the LEDs are thus prone to bending and breaking in which case performance of the turn indicator is compromised. In one prior art light module, a sealant is applied over the surface of circuit board 50, which faces the rear of the mirror. The sealant is apparently provided to protect the circuit components mounted thereon from damage due to moisture. In general, the sealant is not very effective for holding the two unsecured leads of each LED to that surface of the circuit board. Additionally, the sealant may act as a thermal insulator and not allow for sufficient dissipation of heat generated by the circuit components and the LEDs. If the heat dissipation of the LED is reduced, the amount of current that may be passed through the LED without causing failure of the LED is significantly decreased. Because the brightness of the LEDs is a direct function of the current that may be passed through the LEDs, the use of a sealant in this manner may significantly reduce the brightness of the LEDs.

Another problem associated with placing LEDs, particularly those mounted at an angle, to a circuit board behind a mirror and a rearview mirror assembly is the lack of space available for such a configuration. In direct conflict with the desire to provide a multitude of components in the outside rearview mirror body housing is a desire of vehicle designers to make the rearview mirrors as small and as aerodynamic as possible to minimize the mirror's impact of wind noise and vehicle styling. Consequently, there is not a significant volume available within the mirror housing for additional components to be placed. Further, it is desirable to make the weight of the mirror as light as possible to reduce vibration and its associated detrimental impact on rear vision. For these reasons, designers are presented with a significant challenge when attempting to design a signal mirror.

Another problem associated with placing a light module behind a mirror is properly aligning the light sources with the window regions in the mirror.

Another problem associated with providing a multitude of components such as those shown in FIG. 2 within a rearview mirror housing is the resultant difficulty in assembling the mirror housing and attaching it to the vehicle and making the necessary electrical connections. The rearview mirror assembly including an electrochromic mirror, a turn signal indicator, a heater, and a mirror position controller would typically include between three and four separate plug receptacles for connecting to associated plugs extending from the associated wiring in the vehicle. Such plugs take time to ensure proper connection with the associated receptacle, increase the number of parts, and consume additional volume within the limited space of the rearview mirror housing. Additionally, such structures typically included wires extending from the turn signal indicator, the bus bars of the electrochromic mirror, and often from the heater circuit. Such wires add to the cost of the system since they must be appropriately stripped and appropriate soldering, operations, and electrical connections must be made in addition to the fact that such operations introduce possible defects along with breaks in the wiring. In one prior art construction, a heater circuit is provided behind an electrochromic mirror. The heater circuit has three wires soldered thereto that extend to a common connector plug. Two of the three wires provide power to the heater. The third wire is coupled to a conductive trace on the heater that extends to an opposite end of the heater circuit where another wire is soldered for connection to a bus bar of the electrochromic mirror. Another wire extends from the connector plug for connection to the other bus on the electrochromic mirror. Although this construction consolidates two connector plugs into a single plug, it still utilizes four wires soldered to the heater circuit while also requiring soldering of wires to the bus bars of the electrochromic mirror.

As disclosed in commonly assigned U.S. Pat. No. 6,166,848, it is particularly advantageous to utilize what is known as a "third surface reflector" in an outside electrochromic mirror, an example of which is shown in FIG. 4. In such a third surface electrochromic mirror, two electrodes 62 and 64 are provided in electrical contact with an electrochromic medium provided within a chamber 66, which is defined between forward and rearward substrates 11 and 14, respectively, that are spaced apart with a seal 16 disposed therebetween. The forwardmost electrode 62 of the two electrodes is typically made of a transparent conductive material, while the rearwardmost electrode 64 is constructed of a reflective and electrically conductive material. The differences in material result in different resistivities of the electrodes. Accordingly, there is a preferred polarity for the electrical power to be provided to these electrodes. Specifically, it is preferable that the positive power be applied to the forward transparent electrode 62 and the ground connection be provided to the rearwardmost reflective electrode 64. Reversal of the polarity of these connections may result in damage to the electrochromic mirror. Thus, the wiring utilized to connect the electrochromic mirror to the appropriate mirror control circuit could readily be connected in the wrong positions within a plug receptacle thereby accidentally causing damage to the electrochromic mirror. Thus, the use of a third surface electrochromic mirror may further add to the difficulties in providing proper electrical connections to all the components disposed within a rearview mirror housing.

SUMMARY OF THE INVENTION

According to a first embodiment of the present invention, a rearview mirror assembly for a vehicle comprises: a mirror having a surface that is at least partially reflective; a flexible circuit board disposed behind the surface of the mirror, the flexible circuit board having a first surface facing the mirror and a second surface opposite the first surface, the flexible circuit board further including a substantially transparent window; and an LED mounted to the second surface of the flexible circuit board so as to project light through the transparent window in the flexible circuit board and through the mirror.

According to another embodiment, a method is provided for angle mounting an LED to a circuit board comprising the steps of: providing a circuit board having a first surface and second surface opposite the first surface, the circuit board further including at least first and second vias extending between the first and second surfaces; providing an LED having at least a first lead and a second lead; positioning the LED on the circuit board such that the optical axis of the LED is inclined relative to the first surface of the circuit board with the first lead of the LED inserted through the first via and the second lead abutting the first surface of the circuit board in proximity to the second via; soldering the first lead to the second surface of the circuit board; and soldering the second lead to the first surface of the circuit board.

According to another embodiment, an optical radiation emitting assembly comprises: a circuit board having a first surface and second surface opposite the first surface, the circuit board further including at least first and second vias extending between the first and second surfaces; and an optical radiation emitter device having at least a first lead and a second lead, the LED being positioned on the circuit board such that the optical axis of the optical radiation emitter device is inclined relative to the first surface of the circuit board with the first lead of the optical radiation emitter device inserted through the first via and the second lead abutting the first surface of the circuit board in proximity to the second via, wherein the first lead is soldered to the second surface of the circuit board and the second lead is soldered to the first surface of the circuit board.

According to another embodiment, a rearview mirror assembly for a vehicle comprises: a mirror having a surface that is at least partially reflective; a circuit board disposed behind the surface of the mirror and having a first surface and second surface opposite the first surface, the circuit board further including at least first and second vias extending between the first and second surfaces; and an optical radiation emitter device having at least a first lead and a second lead, the LED being positioned on the circuit board such that the optical axis of the optical radiation emitter device is inclined relative to the first surface of the circuit board with the first lead of the optical radiation emitter device inserted through the first via and the second lead abutting the first surface of the circuit board in proximity to the second via, wherein the first lead is soldered to the second surface of the circuit board and the second lead is soldered to the first surface of the circuit board.

According to another embodiment, an optical radiation emitting assembly comprises: a flexible circuit board having a first surface and second surface opposite the first surface; an LED chip mounted to the first surface of the flexible circuit board and electrically coupled to conductive tracings provided on the flexible circuit board; and an encapsulant molded over and around the LED chip.

According to another embodiment, a rearview mirror assembly for a vehicle comprises: a mirror having a surface that is at least partially reflective; a flexible circuit board disposed behind the surface of the mirror and having a first surface and second surface opposite the first surface; an LED chip mounted to the first surface of the flexible circuit board and electrically coupled to conductive tracings provided on the flexible circuit board; and an encapsulant molded over and around the LED chip. The surface of the encapsulant may form a lens to direct the light output of the LED chip at the desired angle. There may or may not be a rigid circuit board attached to the flexible circuit board in the area of the LED die to prevent the die from becoming dislodged. The rigid circuit board may consist of holes that line up with holes in the flexible circuit board to permit the encapsulant material to flow into these holes to increase the adhesiveness of the encapsulating material.

According to another embodiment, a rearview mirror assembly for a vehicle comprises: an electrochromic mirror having front and rear surfaces and first and second electrical connectors disposed along edges of the electrochromic mirror; and a flexible circuit board disposed behind the rear surface of the electrochromic mirror and having a first surface facing the rear surface of the electrochromic mirror and a second surface opposite the first surface, wherein the flexible circuit board includes printed electrical circuits that are terminated with connectors that provide an electrical connection with the electrical connectors of the electrochromic mirror, the printed electrical circuits extending to a common location on the flexible circuit board to provide mirror control terminals for connection to a source of a mirror control signal.

According to another embodiment, a rearview mirror assembly for a vehicle comprises: a mirror having front and rear surfaces; a flexible circuit board disposed behind the rear surface of the mirror and having a first surface facing the rear surface of the mirror and a second surface opposite the first surface; and a turn indicator having at least one light source. The flexible circuit board includes a resistive conductor extending back and forth across the first surface of the flexible circuit board to function as a mirror heater. The resistive conductor begins and ends at a common location on the flexible circuit board to provide heater power terminals for connection to a source of heater power. The flexible circuit board includes conductive paths extending therethrough from a location proximate the light source to the common location to provide turn indicator control terminals proximate the heater power terminals for connection to a source of a turn indicator control signal.

According to another embodiment, a rearview mirror assembly for a vehicle comprises: a mirror having front and rear surfaces; a flexible circuit board disposed behind the rear surface of the mirror and having a front surface facing the rear surface of the mirror and a rear surface opposite the front surface, wherein at least a portion of the flexible circuit is disposed at an angle to the mirror; and at least one light emitting device surface-mounted to the angled portion of the flexible circuit board so as to selectively project light through the mirror at an angle thereto.

According to another embodiment, a rearview mirror assembly for a vehicle comprises: a mirror having front and rear surfaces; a first circuit board disposed behind the rear surface of the mirror and having a front surface facing the rear surface of the mirror and a rear surface opposite the front surface; and a light module having at least one light source mounted to a second circuit board. The first circuit board includes a first plug connector extending from the rear surface thereof. The second circuit board has a second plug connector extending from a front surface thereof for mating engagement with the first plug connector. The first circuit board includes conductive paths extending from the first plug connector to another location to which wiring from the vehicle is coupled to provide lamp module activation signals.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 5 is an exploded perspective view of a first and preferred embodiment of the mirror subassembly of the present invention;

FIG. 6 is a rear view of a flexible circuit board according to one embodiment of the present invention;

FIG. 7 is a cross-sectional view of the flexible circuit board shown in FIG. 6 taken along line VII—VII;

FIG. 9 is a rear view of a printed circuit board constructed in accordance with another embodiment of the present invention;

DETAILED DESCRIPTION OF THE PREFERRED EMBODIMENTS

Figure 1:
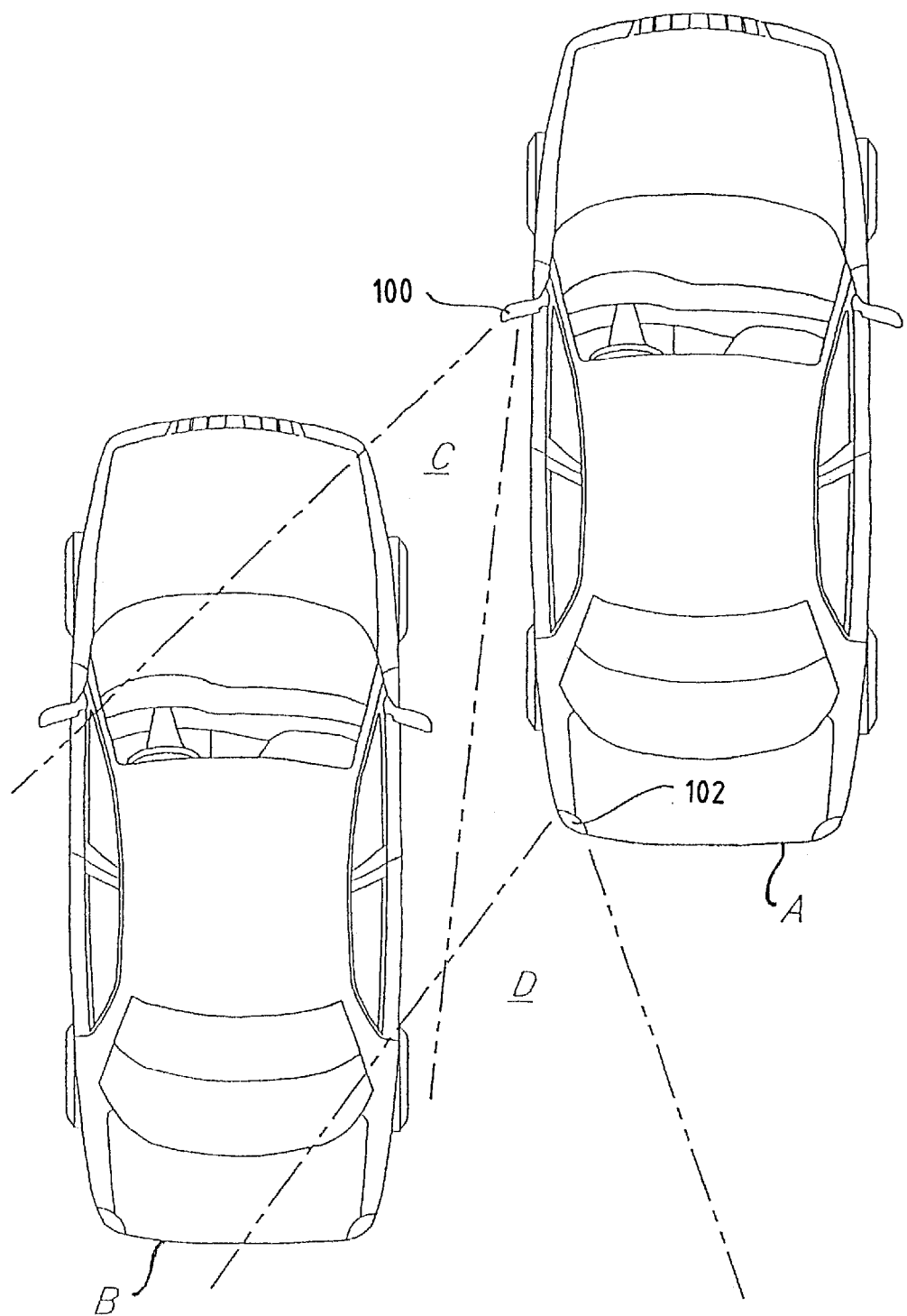
FIG. 1 is a pictorial representation of two vehicles, one of which includes a signal mirror.

Reference will now be made in detail to the present preferred embodiments of the invention, examples of which are illustrated in the accompanying drawings. Wherever possible, the same reference numerals will be used throughout the drawings to refer to the same or like parts.

Figure 2:
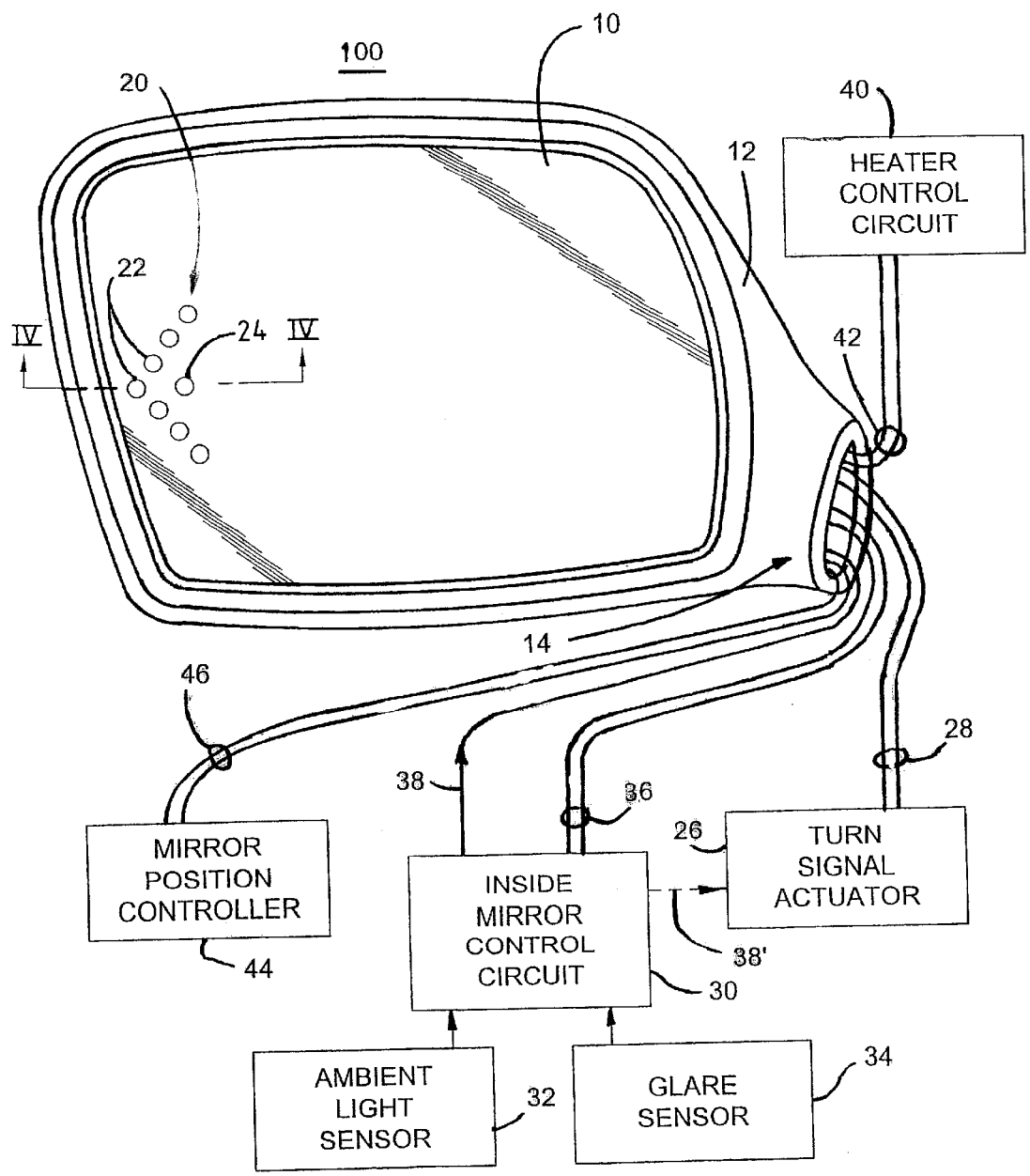
FIG. 2 is a combined perspective view of an outside rearview mirror assembly including a signal light and electrical circuit diagram in block form of circuits that may be coupled to an outside rearview mirror assembly.
Figure 3:
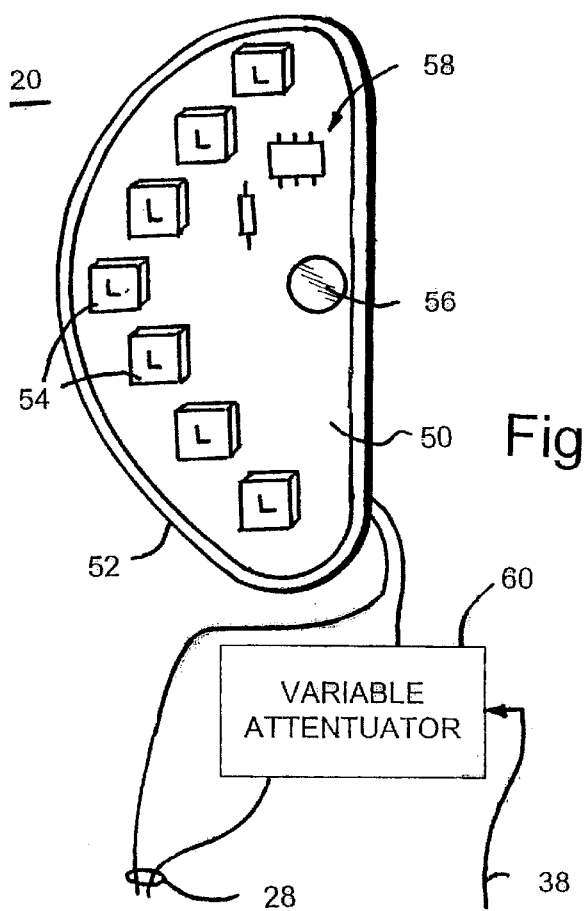
FIG. 3 is a front elevational view of a signal light subassembly that may be used in an outside rearview mirror assembly.

As noted above, the present invention generally pertains to outside rearview mirror assemblies incorporating turn signal indicators and/or flexible circuit boards. When incorporating a turn signal indicator, the outside mirror assembly of the present invention may have an outer appearance resembling that shown in FIG. 2. The present invention, however, differs from the prior art in its internal construction. It should also be noted that various aspects of the present invention may be employed to implement a turn signal indicator on or within the mirror housing about the periphery of the mirror rather than mounting the turn signal indicator behind the mirror.

Figure 4:
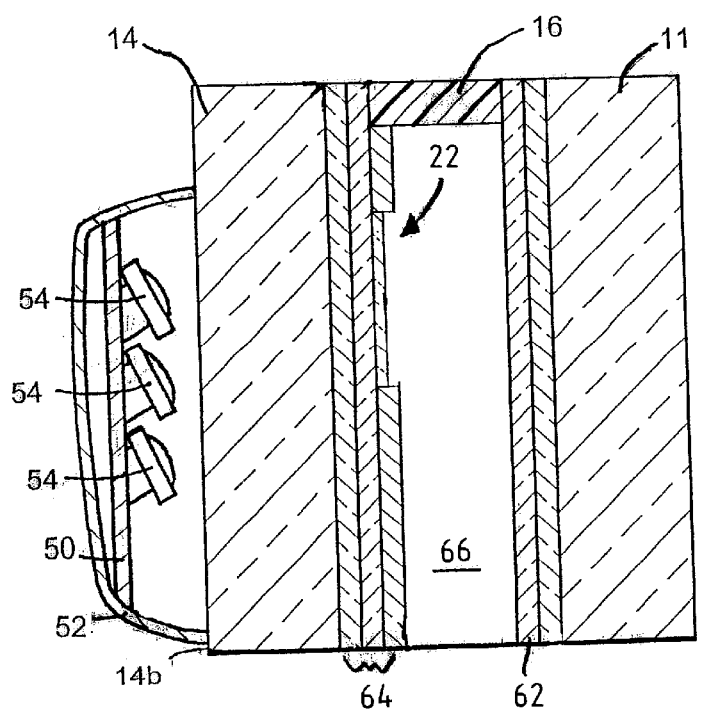
FIG. 4 is a partial cross-sectional view taken along the line IV—IV of FIG. 2 illustrating one construction of an outside rearview mirror subassembly.

FIG. 5 shows an exploded view of a mirror subassembly constructed in accordance with one embodiment of the present invention. The mirror subassembly 200 is mounted to a mirror actuator (not shown), which is fixedly mounted to the interior of a mirror housing, such as mirror housing 12 shown in FIG. 2, in order to move mirror subassembly 200 relative to housing 12. Mirror subassembly 200 thus includes a mirror, preferably an electrochromic mirror having a structure similar to that shown in FIG. 4. It will be appreciated, however, that in various embodiments of the present invention, the mirror may be a prismatic mirror rather than an electrochromic mirror or may have any conventional construction. As discussed above with reference to FIG. 4, the electrochromic mirror generally includes a front transparent element 11, a rear transparent element 14, and a seal 16 extending around the periphery to maintain elements 11 and 14 in a spaced-apart, parallel relationship with a chamber defined therebetween. An electrochromic medium is then dispersed within this chamber. As discussed above with respect to FIG. 4, a transparent conductive electrode is disposed on the rearward surface of front element 11 while a second electrode is disposed on the front surface of rear element 14. The electrode disposed on element 14 may also be transparent, in which case a reflective layer is disposed on the rear surface 14b of rear element 14. Alternatively, the electrode disposed on the front surface of element 14 may be at least partially reflective to function as both an electrode and a reflector.

As also shown in FIG. 5, a first electrically conductive bus clip 202 is secured along at least one edge of front element 11 in electrical contact with the electrode provided on its rear surface. Similarly, a second bus clip 204 is clipped along at least one edge of rear element 14 in electrical contact with the electrode disposed on the front surface of rear element 14. Bus clips 202 and 204 thus provide part of the electrical path extending to and from the electrodes of the electrochromic mirror.

Mirror subassembly 200 further includes a printed circuit board 206, which may be a rigid circuit board or a flexible circuit board. In a most preferred embodiment, circuit board 206 is a flexible circuit board having electric heater element tracings printed on the front side of circuit board 206, which faces rear surface 14b of the mirror element. As will be discussed further below, an electrical connector plug 208 is provided on the rear surface of circuit board 206 for mating connection with a corresponding plug 210 extending from a wire harness 212 of the vehicle for selectively applying power to the heater circuit that is printed on the front surface of circuit board 206. Connector plug 208, as well as corresponding plug 210 and harness 212, may also be utilized to provide power and/or control signals to a turn signal indicator 220 as well as power or other control signals to the electrochromic mirror. As will be described further below, electrically conductive tracings may be printed on the printed circuit board 206 extending from connector plug 208 to the circuit elements of which turn signal indicator 220 is composed. Additionally, conductive tracings may be printed on circuit board 206 that extend from connector plug 208 to corresponding finger extensions 215a and 215b, which in turn provide an electrical connection to connector clips 216a and 216b, respectively. Connector clips 216a and 216b are configured to be physically and electrically coupled to bus bar clips 202 and 204, respectively. Additional circuit elements may be mounted to printed circuit board 206, such as a reverse polarity protection circuit including a diode 218 or the like. Although connector plugs 208 and 210 are shown as including pins and pin receptacles, the connector plugs may have any form including that of lugs and lug receptacles.

Turn signal indicator 220 may be configured to be disposed on a flap 222 that is cut out from a portion of the flexible circuit board and bent slightly at an angle. A plurality of LEDs 250 may be mounted to the portion of flap 222 that is bent slightly backward so as to project light outward through the mirror and away from the driver, as discussed further below. The angle which the circuit board is bent backward maybe set by the lens of the LEDs or held in place with a bracket or some other similar method.

Printed circuit board 206 may be mounted so as to be spaced slightly apart from the rear surface 14b of the mirror element or may be secured directly to rear surface 14b by an adhesive layer.

Mirror subassembly 200 further includes a bezel 230 and a carrier plate 240. Bezel 230 includes a forward lip that extends over the front surface of front element 11 of the electrochromic mirror. Bezel 230 further includes a rearward extending frame that extends about the periphery of the electrochromic mirror and the printed circuit board 206. Bezel 230 is mechanically connected to carrier plate 240 in order to secure the mirror and circuit board 206 therebetween. The connection of bezel 230 and carrier plate 240 may be accomplished in any conventional manner.

Carrier plate 240 preferably includes an opening 242 lined by a rim 244 that is configured for attachment to an actuator mechanism that allows mirror subassembly 200 to be pivoted along two axes relative to the mirror housing in which the mirror subassembly is mounted. Carrier plate 240 also preferably includes either an opening or recess 246 for accommodating turn signal indicator 220.

FIG. 6 shows a rear view of printed circuit board 206, which includes connector plug 208 and a single flap 222 to which one or more LEDs are mounted to the opposite side. FIG. 7 is a cross-sectional view taken along line VII—VII of the printed circuit board 206 shown in FIG. 6. As shown in FIG. 7, printed circuit board 206 includes a flexible Mylar layer 226 and a layer of copper and PTC 228 disposed on the front surface thereof, the copper corresponding to the conductive tracings on the front surface of circuit board 206. An optional copper ground layer 229 may be printed on the rear surface of circuit board 206.

Figure 8:
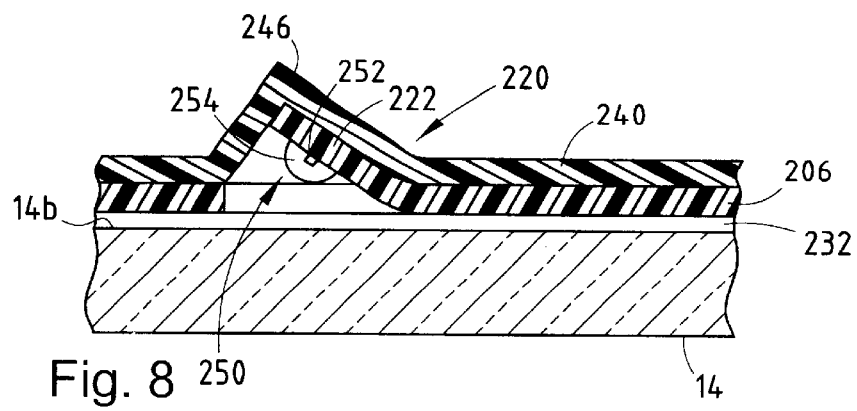
FIG. 8 is a cross-sectional view of the flexible circuit board and light module shown in FIG. 6 taken along line VIII—VIII.
Figure 12:
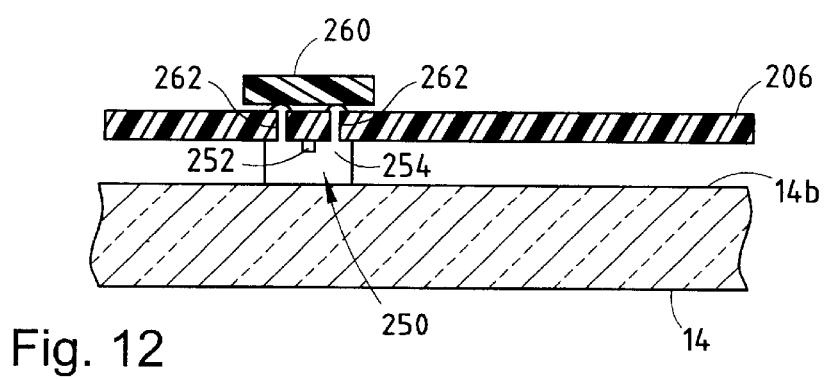
FIG. 12 is a cross-sectional view of a flexible circuit board and lamp assembly constructed in accordance with another embodiment of the present invention.

FIG. 8 is a partial cross-sectional view taken along line VIII—VIII shown in FIG. 6. As shown in FIG. 8, printed circuit board 206 is secured to rear surface 14b of rear element 14 by an adhesive layer 232. The flap portion 222 of printed circuit board 206 is secured to the forward surface of the pocket 246 formed in carrier plate 240 by an adhesive or other mechanism. This maintains flap 222 in an inclined angle relative to the remainder of printed circuit board 206 and the rear surface 14b of mirror element 14. As shown in FIGS. 8 and 12, LED 250 may include an LED chip 252 that is surface mounted directly on the forward-facing surface of flap 222 of circuit board 206. Preferably, an encapsulant 254 is transfer-molded onto printed circuit board 206 over LED chip 252 to protect and secure LED 250 to the forward-facing surface of circuit board 206. The encapsulant 254 may be shaped so as to provide an integral lens for optically modifying the light emitted from LED chip 252. By angling flap 222 to which LED 250 is mounted, the primary optical axis of LED 250 is inclined at an angle relative to the mirror element. This allows the majority of the light emitted from LED chip 252 to be projected away from the line of sight of the driver.

With the possible exception of the recess 246 in carrier plate 240, the structure of the first embodiment described above consumes very little volume inside the rearview mirror housing. In the event it is desirable to mount circuit components to the rear surface of circuit board 206, apertures may be formed through carrier plate 240 in the location of the circuit components so as to accommodate the circuit components and maintain the low profile of the subassembly. An example of such a construction is disclosed in commonly assigned U.S. Pat. No. 6,244,716. The first embodiment is further advantageous insofar as the number of parts and components required for constructing a turn signal indicator 220 are minimized. Additionally, by providing a six-pin connector plug 208, electrical coupling to the wire harness of the vehicle is significantly simplified. The shape of the connector plug 208 may be made non-symmetric so as to ensure proper coupling with a correspondingly non-symmetric connector plug attached to the wire harness. Such a non-symmetric plug shape serves to prevent the incorrect voltage potential to be applied to the connections of the electrochromic mirror, the heater, and the turn indicator.

FIG. 9 shows a second embodiment of the present invention which is very similar to the first embodiment with the exception that the single flap 222 of the first embodiment is replaced with a plurality of flaps 222, with one flap provided for each LED.

Figure 11:
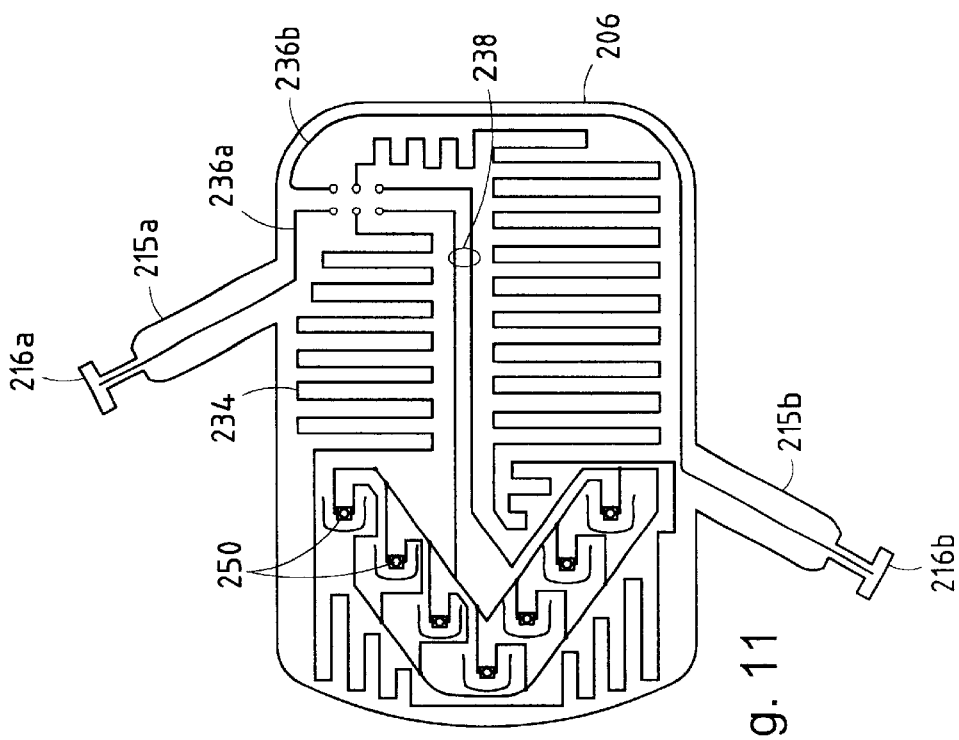
FIG. 11 is a front view of the circuit board shown in FIG. 10.
Figure 10:
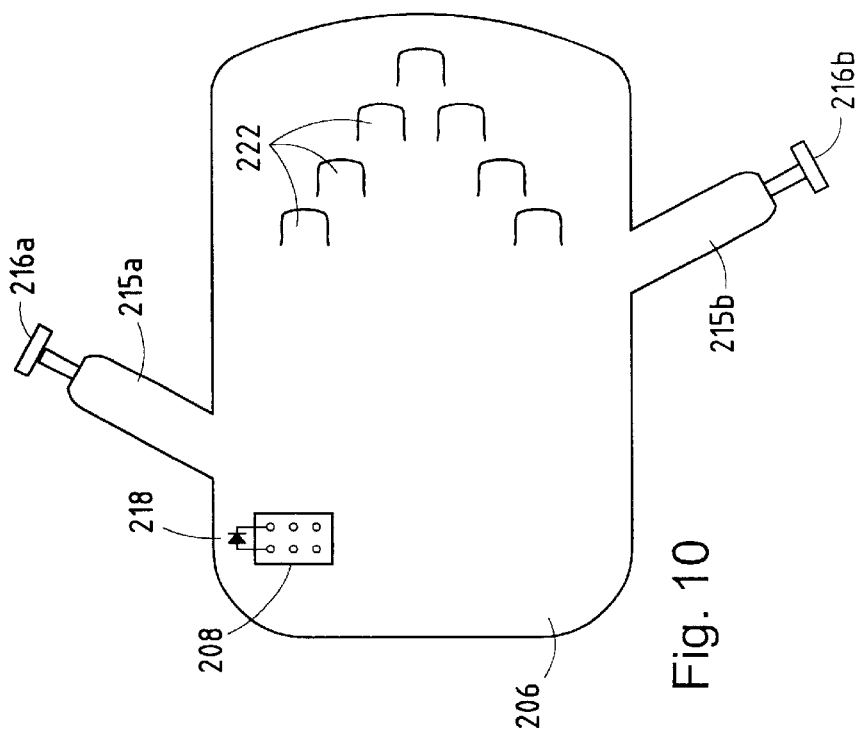
FIG. 10 is a rear view of a flexible circuit board constructed in accordance with another embodiment of the present invention.

FIGS. 10 and 11 show a third embodiment of the present invention, which is similar to the second embodiment with the exception that printed circuit board 206 includes finger extensions 215a and 215b and corresponding connector clips 216a and 216b, which are provided for connection to the bus bar clips of an electrochromic mirror. Additionally, a diode 218 is shown to provide reverse voltage protection from the turning signal circuitry which is part of printed circuit board 206. An additional diode or diodes (not shown) may also be provided for reverse polarity protection of the electrochromic mirror element. FIG. 10 shows the rear surface of printed circuit board 206 whereas FIG. 11 shows the front surface of printed circuit board 206. As shown in FIG. 11, conductive tracings 234 are provided in a serpentine manner across most of the front surface of printed circuit board 206 to function as a heater circuit that selectively heats the mirror element to which printed circuit board 206 is secured. It should be noted that any adhesive layer 232 provided between circuit board 206 and mirror element 14 should be sufficiently thermally conductive to allow heat generated by the heater circuit to efficiently transfer to the mirror element.

The printed circuit board 206 of the third embodiment preferably includes a pair of conductive tracings 236a and 236b, which extend from locations approximate the corresponding pins of connector plug 208 to conductive clips 216a and 216b, respectively. Further, a pair of conductive tracings 238 may extend from the location underlying plug 208 to the plurality of LEDs 250 mounted on the forward surface of circuit board 206. Current limiting resistors (not shown) to be coupled to LEDs 250 can be either surface mount components or carbon ink resistors. The die of a reverse protection diode could also be placed onto the copper circuitry to protect from backpowering the wire harness from LEDs 250 from improper electrical connection.

FIG. 12 shows an alternative technique for forming an LED 250 directly on the forward-facing surface of a flexible printed circuit board 206. As shown, LED 250 includes an LED chip 252, which again is surface mounted directly on the forward-facing surface of flexible circuit board 206. An encapsulant 254 is again transfer-molded onto the circuit board 206 over LED chip 252. Unlike the encapsulant in the embodiment shown in FIG. 8, the encapsulant shown in FIG. 12 is shaped to function as a prism or other optical element for directing the light from LED chip 252 from the LED along a primary optical axis that is inclined at an angle relative to the printed circuit board 206 and the mirror element. In this case, however, the portion of printed circuit board 206 to which LED 250 is mounted need not be inclined, but may be parallel to the rear surface 14b of the rear element 14 of the mirror. It should be appreciated that circuit board 206 may be a rigid circuit board and need not be flexible.

To protect the LED 250 from being "popped" off the circuit board 206 and to enable die mounting, a cardboard or printed circuit board serving as a "backer board" 260 may be secured behind the LED 250. This helps to stiffen circuit board 206 in the event it is a flexible circuit board. Additionally or alternatively, a plurality of vias 262 may be provided through circuit board 206 in the vicinity of LED chip 252 so as to allow encapsulant 250 to flow through vias 262 and mushroom slightly on the opposite side of circuit board 206. This technique helps to ensure LED 250 remains securely attached to circuit board 206.

Figure 13:
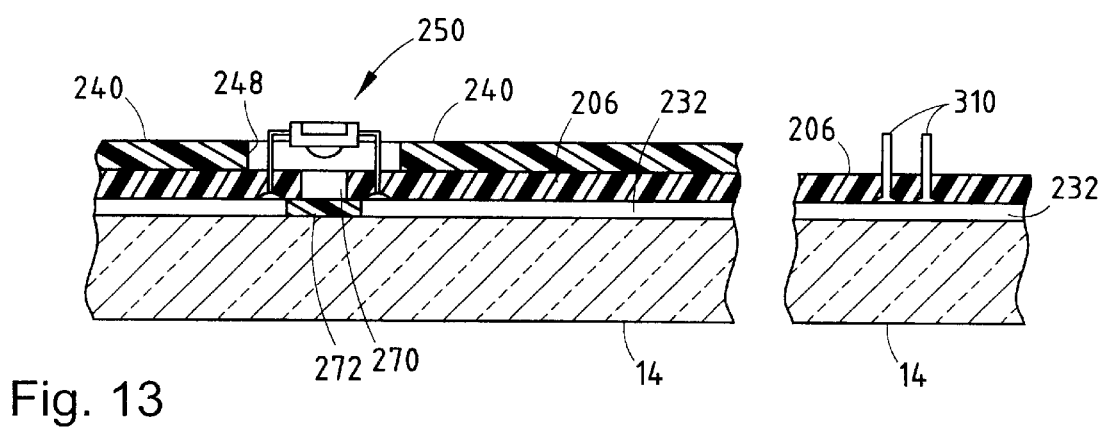
FIG. 13 is a cross-sectional view of a circuit board and lamp assembly constructed in accordance with another embodiment of the present invention.

FIG. 13 shows a cross-sectional view of a fourth embodiment of the present invention whereby an LED device 250 is mounted to the rear surface of a circuit board 206, which again is preferably a flexible circuit board. To allow light to pass through circuit board 206, an aperture or other transparent region 270 is provided in circuit board 206 in the area in front of LED 250. This substantially transparent region or window 270 may have a diffusant dispersed integrally therein or may have a roughened surface so as to diffuse the light from the LED device 250. An aperture 248 may be formed in carrier plate 240 to accommodate the height of LED 250 extending rearwardly behind the rear surface of printed circuit board 206. In the embodiment shown in FIG. 13, an optical deviator film 272 is provided over the transparent region 270 of circuit board 206 and in front of LED 250. In this manner, LED 250 may be mounted with its optical axis normal to the printed circuit board 206 with the optical deviator film 272 utilized to redirect the light from LED 250 at an angle relative to the mirror and flexible circuit board 206 in a direction away from the driver's eyes. It should be recognized to those skilled in the art that optical deviator film 272 may also be integral within flexible circuit 206. In addition, the deviator film may also contain a diffused surface that evenly distributes the light emitted by LED device 250 to present a more pleasing appearance. Alternatively or additionally, the rear surface of the mirror that is disposed in front of the LED device, may be treated to diffuse the light from the LED device. A separate diffuser element may also be placed between the mirror and optical deviator 272.

Figure 14:
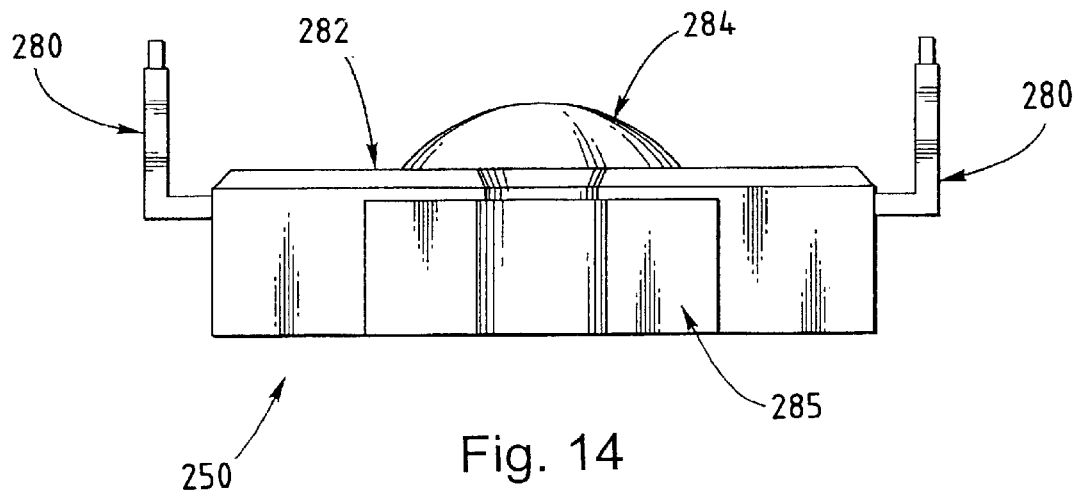
FIG. 14 is an elevational side view of an LED device that may be utilized in some of the embodiments of the present invention.
Figure 15:
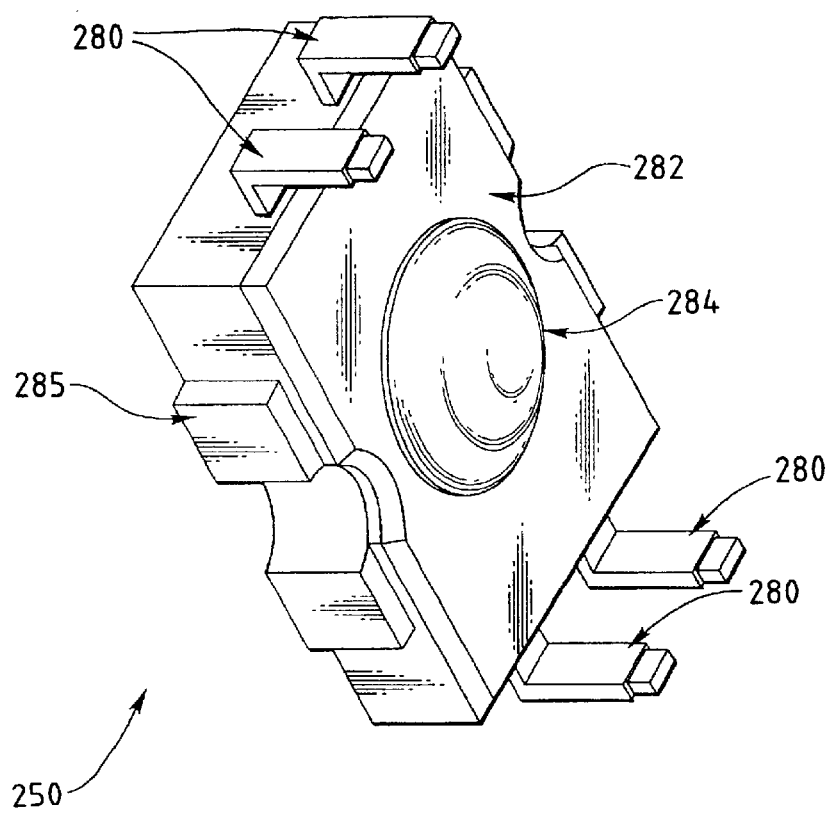
FIG. 15 is a perspective view of the LED device shown in FIG. 14.
Figure 16:
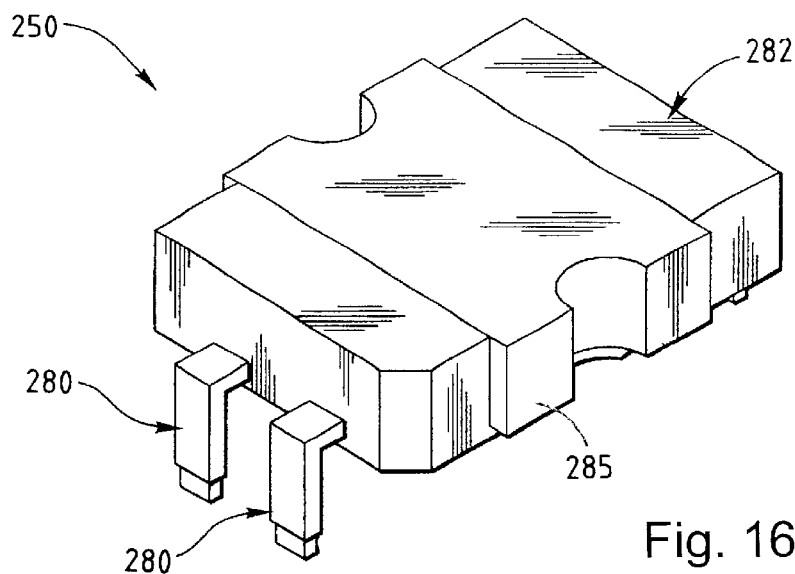
FIG. 16 is a perspective view of the opposite side of the LED device shown in FIG. 15.

FIGS. 14–16 illustrate a preferred construction for LED 250 for use in the embodiment shown in FIG. 13. As shown in FIGS. 14–16, LED 250 includes four leads 280 extending outward from an encapsulant 282 in which an integral lens 284 is formed. Two of leads 280 extend from one side of the LED device while the other two leads 280 extend from an opposite side. Leads 280 are bent at a 90-degree angle such that their distal ends extend in the same direction of the LED device in which light is emitted. LED device 250 also preferably includes a heat extraction member 285 to which the LED chip(s) is/are thermally coupled so as to provide a primary thermal path from the LED chips to the exterior of the LED device that has a lower thermal resistance than leads 280. Details of the structure of LED 250 and the method of making LED 250 are disclosed in commonly assigned U.S. Pat. No. 6,335,548, the entire disclosure of which is incorporated herein by reference. Although not shown in FIG. 13, a heat sink may be secured to the rear sides of LEDs 250 so as to increase the dissipation of thermal energy from LEDs 250 and thereby allow LEDs 250 to be driven with larger currents thereby increasing the brightness levels of LEDs 250 as can be done with any of the preferred embodiments.

Figure 17:
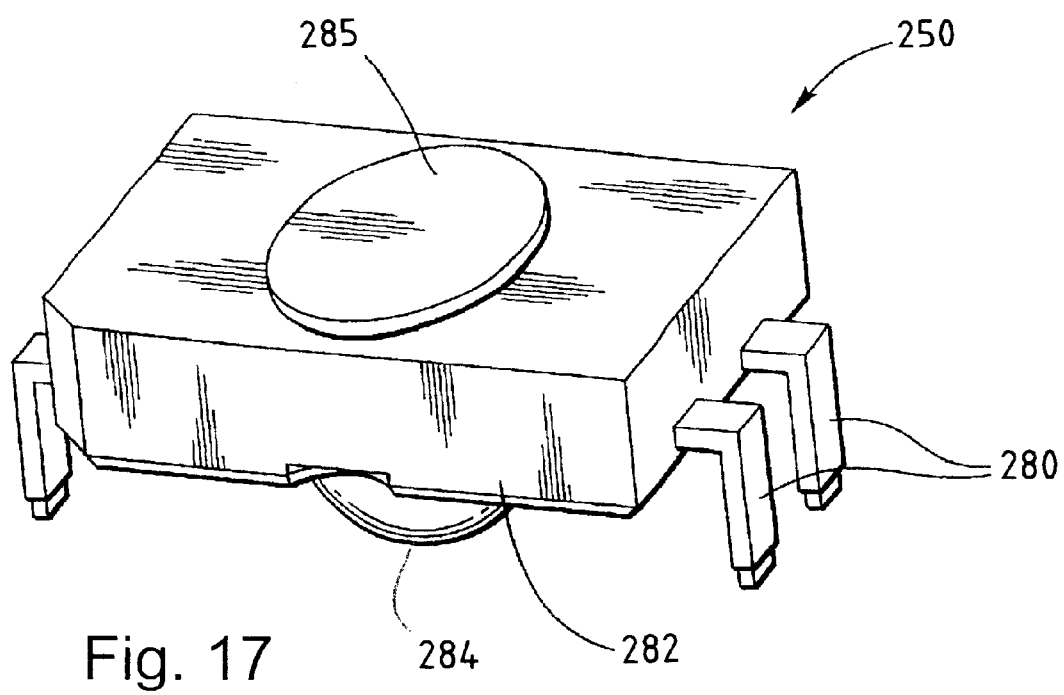
FIG. 17 is a perspective view of an alternative LED device construction that may be used in some of the embodiments of the present invention.

FIG. 17 shows a slightly different construction for LED 250 from that shown in FIGS. 14–16, insofar as heat extraction member 285 is configured to extend only from the opposite side of encapsulant 282 from integral lens 284.

Figure 18:
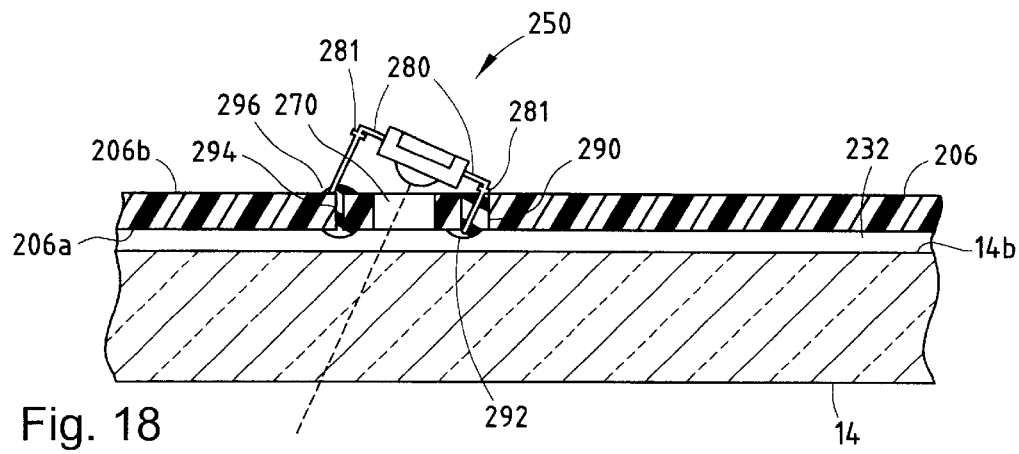
FIG. 18 is a cross-sectional view of a circuit board and lamp assembly constructed in accordance with another embodiment of the present invention.

FIG. 18 shows yet another embodiment whereby an LED 250 of a turn signal indicator or other indicator mechanism is mounted to the rear surface of a circuit board 206, which again is preferably a flexible circuit board having an aperture or other transparent region 270 provided in front of LED device 250. As shown in FIG. 18, this embodiment differs from the embodiment shown in FIG. 13 in that LED 250 is mounted with its primary optical axis at an angle relative to printed circuit board 206 instead of utilizing an optical deviator film 272. In this embodiment, LED 250 preferably has one of the configurations shown in FIGS. 14–17.

As shown in FIG. 18, the leads 280 of LED device 250 preferably include standoffs 281, which serve to limit the insertion depth of some of the leads 280 into vias 290 formed through printed circuit board 206. Preferably, two of leads 280 extending from a common side of LED device 250 are inserted in two corresponding vias 290 formed through circuit board 206 such that LED device 250 is disposed behind the rear surface 206b of circuit board 206. The distal ends of the leads 280 inserted through vias 290 are then preferably soldered to the copper tracings on the front surface 206a of circuit board 206. The solder 292 serves to hold LED 250 in place. The other two leads 280 are preferably positioned such that their distal ends abut the rear surface 206b of circuit board 206. Thus, the length of the leads 280 that abut the rear surface 206b as well as the position of the standoffs 281 on the other LED leads serve to define the angle at which the LED 250 is mounted relative to circuit board 206.

As further shown in FIG. 18, a second set of vias 294 is preferably provided through circuit board 206. The rearward opening of vias 294 is preferably located proximate the position on the rear surface 206b of circuit board 206 where LED leads 280 abut. Then, solder 296 may be applied within vias 294 so as to mushroom outward from either end of the vias and to extend over the distal portions of the LED leads 280 to hold the leads firmly in place relative to the circuit board. This prevents bending and breaking of the LED device while providing additional heat sinking via those leads and the solder.

Figure 20:
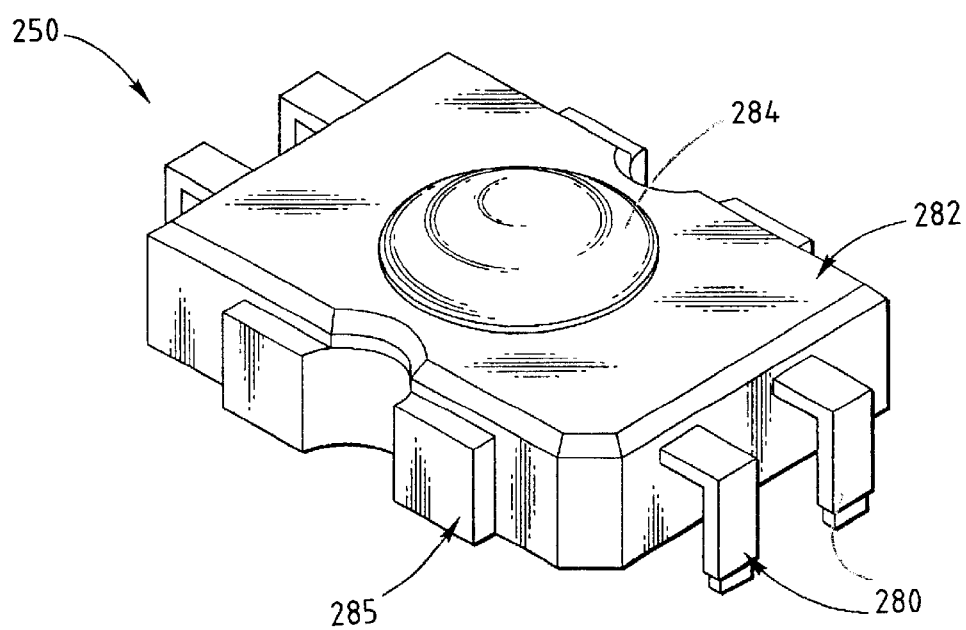
FIG. 20 is a perspective view of an alternative LED device construction that may be used in some of the embodiments of the present invention.
Figure 19:
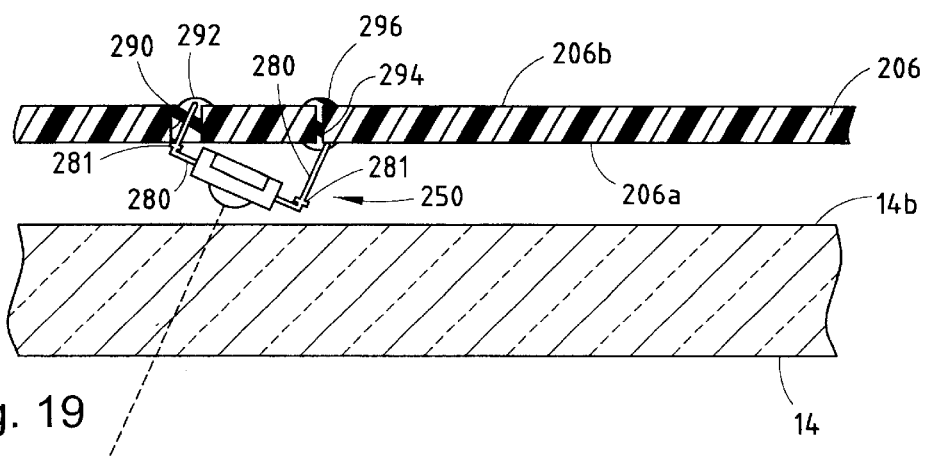
FIG. 19 is a cross-sectional view of a circuit board and lamp assembly constructed in accordance with another embodiment of the present invention.

FIG. 19 shows yet another embodiment of the present invention in which an LED device 250 is mounted to the forward-facing surface 206a of a printed circuit board 206, which may be either rigid or flexible. The angle-mounting technique used in the embodiment shown in FIG. 19 is similar to that utilized in FIG. 18. Specifically, two of the four LED leads 280 are inserted into a first set of vias 290 with a standoff of those leads limiting the insertion depth. Solder 292 is then applied at the rearward surface 206b of circuit board 206 to hold the LED 250 in place. Electrical connection may be made to tracings that are printed on either surface of circuit board 206. A second set of vias 294 is provided through circuit board 206, with the opening at the forward surface 206a being proximate in position to the location at which the other two non-inserted LED leads 280 abut front surface 206a. Solder 296 is then applied to via 294 so as to extend over the non-inserted LED leads and through the via 294 thereby securely holding those leads in place relative to the circuit board. A preferred construction for LED 250 used in the embodiment shown in FIG. 19 is shown in FIG. 20. This LED construction is very similar to that shown in FIGS. 14–16, with the exception that leads 280 are bent in an opposite direction from integral lens 284. The details of the construction of the LED shown in FIG. 20 is described in more detail in U.S. Pat. No. 6,335,548, the entire disclosure of which is incorporated herein by reference.

Figure 21:
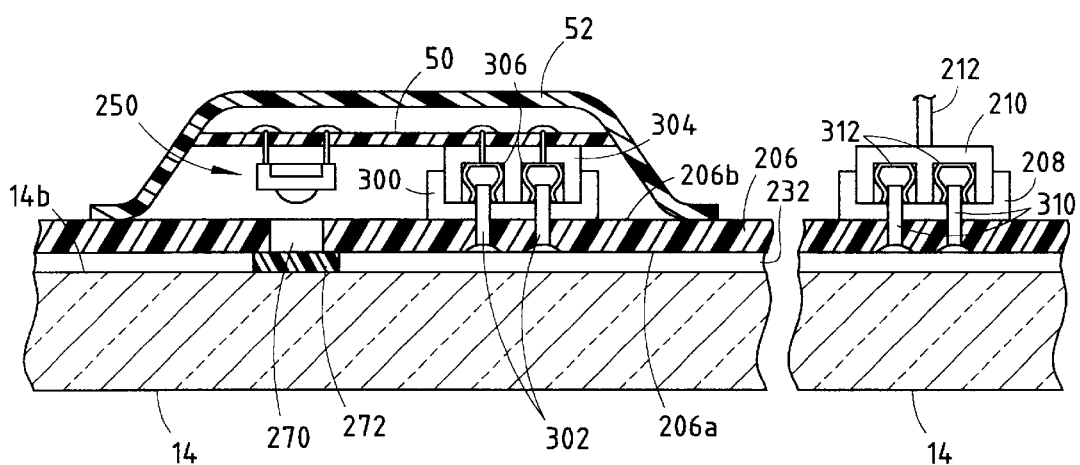
FIG. 21 is a cross-sectional view of a circuit board and lamp assembly constructed in accordance with another embodiment of the present invention.

FIG. 21 shows yet another embodiment of the present invention. As illustrated, the LEDs 250 are mounted to a separate circuit board 50 that is contained within a light module housing 52 in much the same manner as disclosed in FIG. 4. This construction differs, however, in several respects. Specifically, flexible circuit board 206, which preferably has conductive heater tracings on its front surface 206a, is adhesively secured to the rear surface 14b of mirror element 14. A transparent region or aperture 270 is formed in circuit board 206 in an area in front of the LEDs 250. The LEDs 250 may be angle-mounted to circuit board 50 in a manner similar to that shown in FIG. 19, or may be mounted with their optical axes normal to the surface of circuit board 206 with the light deviating film 272 provided between circuit board 206 and LED 250 to deviate the axes away from the eyes of the driver. The deviator film may also be mounted within flexible circuit board 206. Also, unlike FIG. 4, the light module does not include separate wires and a plug that extend from the light module housing 52, but instead mating plug connectors 300 and 304 are provided on circuit boards 206 and 50, respectively, to allow the light module to be simply plugged into circuit board 206. Circuit board 206 would include electrical connectors 302 that are electrically connected to conductive tracings on circuit board 206 that extend to the electrical contacts 310 of a plug 208 in the manner previously described. Connector plug 304 extending forward of circuit board 50 includes electrical connectors 306 that are soldered to traces on circuit board 50 that provide electrical connection to LEDs 50 and any other circuit elements that may be printed on the forward-facing surface of circuit board 50.

Connector plugs 300 and 304 not only provide the benefit of ease of electrical connection to the vehicle wiring harness, but also provide a mechanism for positioning the light module on circuit board 206 and mirror 14 such that LEDs 250 are in registration and aligned with regions 270 and corresponding windows (not shown) in the mirror reflector. Light module housing 52 may be secured to the assembly by latch mechanisms or other structures in the carrier plate (not shown) in any manner including those disclosed in commonly assigned U.S. patent application Ser. No. 09/862,414 entitled "REARVIEW MIRROR CONSTRUCTED FOR EFFICIENT ASSEMBLY" filed on May 21, 2001, by Bradley L. Busscher et al., the entire disclosure of which is incorporated herein by reference.

Where possible, it is preferable that LEDs 250 are constructed in accordance with the teachings of commonly assigned U.S. Pat. No. 6,335,548 so as to increase the brightness levels obtainable by the LEDs. The efficiency of the LEDs may further be increased by providing appropriate heat sinking. Examples of heat sinking such LEDs in rearview mirror assemblies is disclosed in commonly assigned U.S. patent application Ser. No. 09/425,792 entitled "INDICATORS AND ILLUMINATORS USING A SEMICONDUCTOR RADIATION EMITTER PACKAGE," filed on Oct. 22, 1999, by John K. Roberts et al., now U.S. Pat. No. 6,441,943, the entire disclosure of which is incorporated herein by reference.

Although the present invention has generally been described with respect to light modules mounted behind the mirror subassembly so as to project light through the mirror, various aspects of the present invention may be employed in rearview mirror assemblies where the light module projects light not from behind the mirror, but outside the periphery of the mirror or in the front or side of the mirror assembly. For example, the flexible circuit board and the techniques for mounting LEDs to the circuit board may be used in the light module regardless of its position in the mirror assembly. Likewise, the techniques for angle-mounting LEDs to circuit boards may also be utilized regardless of the location of the light module. Other aspects may similarly be utilized in locations besides those behind the mirror.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A rearview mirror assembly for a vehicle comprising:
   a mirror having a surface that is at least partially reflective;
   a flexible circuit board disposed behind the surface of said mirror, said flexible circuit board having a first surface facing said mirror and a second surface opposite the first surface, said flexible circuit board further including a substantially transparent window; and
   an LED mounted to said second surface of said flexible circuit board so as to project light through the transparent window in said flexible circuit board and through said mirror.

2. The rearview mirror assembly of claim 1, wherein said flexible circuit board includes a plurality of transparent windows, and the rearview mirror assembly further comprises a plurality of LEDs mounted to said second surface of said flexible circuit board so as to project light through the substantially transparent windows in said flexible circuit board and through said mirror.

3. The rearview mirror assembly of claim 1, wherein said substantially transparent window is an aperture extending through said flexible circuit board.

4. The rearview mirror assembly of claim 1, wherein said LED is mounted such that its optical axis is inclined relative to said second surface of said flexible circuit board.

5. The rearview mirror assembly of claim 1, wherein said flexible circuit board further includes at least first and second vias extending between the first and second surfaces, said LED having at least a first lead and a second lead and being positioned on said flexible circuit board such that the optical axis of said LED is inclined relative to the first surface of said flexible circuit board with the first lead of said LED inserted through said first via and the second lead abutting the first surface of said flexible circuit board in proximity to the second via, wherein the first lead is soldered to the second surface of said flexible circuit board and the second lead is soldered to the first surface of said flexible circuit board.

6. The rearview mirror assembly of claim 1, wherein said mirror is an electrochromic mirror having first and second electrodes in contact with an electrochromic medium.

7. The rearview mirror assembly of claim 1 and further comprising a mirror heater circuit disposed on said flexible circuit board.

8. The rearview mirror assembly of claim 1, wherein said LED includes a heat extraction member.

9. The rearview mirror assembly of claim 1, wherein said LED is mounted to said flexible circuit board with its optical axis normal to said flexible circuit board, and wherein said rearview mirror assembly further comprises an optical deviator disposed between said LED and said mirror so as to redirect light emitted from said LED along an axis that is not normal to said flexible circuit board.

10. The rearview mirror assembly of claim 9 and further including a diffuser disposed so as to diffuse light passing through said optical deviator.

11. The rearview mirror assembly of claim 10, wherein said diffuser is a diffused surface on said mirror.

12. The rearview mirror assembly of claim 10, wherein said diffuser is positioned between said mirror and said optical deviator.

13. The rearview mirror assembly of claim 1, wherein:
said mirror is an electrochromic mirror having front and rear surfaces and first and second electrical connectors disposed along edges of said electrochromic mirror,
said flexible circuit board is disposed behind the rear surface of said electrochromic mirror and has a first surface facing the rear surface of said electrochromic mirror and a second surface opposite the first surface,
said flexible circuit board includes printed electrical paths that extend to connectors that provide an electrical connection with said electrical connectors of said electrochromic mirror, and
said printed electrical paths extending to a common location on said flexible circuit board to provide mirror control terminals for connection to a source of a mirror control signal.

14. The rearview mirror assembly of claim 1, wherein said substantially transparent window is diffuse and diffuses the light emitted from said LED.

15. A method of angle-mounting an LED to a circuit board comprising the steps of:
providing a circuit board having a first surface and second surface opposite the first surface, said circuit board further including at least first and second vias extending between the first and second surfaces;
providing an LED having at least a first lead and a second lead;
positioning said LED on said circuit board such that the optical axis of the LED is inclined relative to the first surface of said circuit board with the first lead of said LED inserted through said first via and the second lead abutting the first surface of said circuit board in proximity to the second via;
soldering the first lead to the second surface of said circuit board; and
soldering the second lead to the first surface of said circuit board such that solder is applied so as to be disposed within the second via and extend to the first surface.

16. The method of claim 15, wherein said circuit board is a flexible circuit board.

17. An optical radiation emitting assembly comprising:
a circuit board having a first surface and second surface opposite the first surface, said circuit board further including at least first and second vias extending between the first and second surfaces; and
an optical radiation emitter device having at least a first lead and a second lead, said optical radiation emitter device being positioned on said circuit board such that the optical axis of said optical radiation emitter device is inclined relative to the first surface of said circuit board with the first lead of said optical radiation emitter device inserted through said first via and the second lead abutting the first surface of said circuit board in proximity to the second via, wherein the first lead is soldered to the second surface of said circuit board and the second lead is soldered to the first surface of said circuit board.

18. The optical radiation emitting assembly of claim 17, wherein the solder is applied to the second lead so as to be disposed within the second via and extend to the second surface.

19. The optical radiation emitting assembly of claim 17, wherein said circuit board is a flexible circuit board.

20. The optical radiation emitting assembly of claim 17, wherein said optical radiation emitter device is an LED device.

21. A rearview mirror assembly for a vehicle comprising:
a mirror having a surface that is at least partially reflective;
a circuit board disposed behind said surface of said mirror and having a first surface and second surface opposite the first surface, said circuit board further including at least first and second vias extending between the first and second surfaces; and
an optical radiation emitter device having at least a first lead and a second lead, said optical radiation emitter device being positioned on said circuit board such that the optical axis of said optical radiation emitter device is inclined relative to the first surface of said circuit board with the first lead of said optical radiation emitter device inserted through said first via and the second lead abutting the first surface of said circuit board in proximity to the second via, wherein the first lead is soldered to the second surface of said circuit board and the second lead is soldered to the first surface of said circuit board.

22. The rearview mirror assembly of claim 21, wherein said optical radiation emitter device emits light through said mirror.

23. The rearview mirror assembly of claim 22, wherein said mirror is partially transmissive at least in a region in front of said optical radiation emitter device.

24. The rearview mirror assembly of claim 21, wherein said mirror is an electrochromic mirror having first and second electrodes in contact with an electrochromic medium.

25. The rearview mirror assembly of claim 21, wherein the solder is applied to the second lead so as to be disposed within the second via and extend to the second surface.

26. The rearview mirror assembly of claim 21, wherein said circuit board is a flexible circuit board.

27. The rearview mirror assembly of claim 21, wherein said optical radiation emitter device is an LED device.

28. An optical radiation emitting assembly comprising:
a flexible circuit board having a first surface and second surface opposite the first surface;
an LED chip mounted to the first surface of said flexible circuit board and electrically coupled to conductive tracings provided on said flexible circuit board; and
an encapsulant molded over and around said LED chip.

29. The optical radiation emitting assembly of claim 28, wherein said flexible circuit board includes at least one through hole proximate said LED chip and said encapsulant is molded so as to flow through said through hole to the second surface of said circuit board.

30. The optical radiation emitting assembly of claim 28, wherein said encapsulant defines an integral lens.

31. The optical radiation emitting assembly of claim 30, wherein said integral lens directs light from said LED chip at an angle relative to said flexible circuit board.

32. The optical radiation emitting assembly of claim 28 and further comprising a backing board secured to said second surface of said flexible circuit board.

33. A rearview mirror assembly for a vehicle comprising:
a mirror having a surface that is at least partially reflective;
a flexible circuit board disposed behind said surface of said mirror and having a first surface and second surface opposite the first surface;
an LED chip mounted to the first surface of said flexible circuit board and electrically coupled to conductive tracings provided on said flexible circuit board; and
an encapsulant molded over and around said LED chip.

34. The rearview mirror assembly of claim 33, wherein said mirror is an electrochromic mirror having first and second electrodes in contact with an electrochromic medium.

35. The rearview mirror assembly of claim 33, wherein a portion of said flexible circuit board on which said LED chip is mounted is bent at an angle relative to said surface of said mirror.

36. The rearview mirror assembly of claim 33, wherein said flexible circuit board includes at least one through hole proximate said LED chip and said encapsulant is molded so as to flow through said through hole to the second surface of said flexible circuit board.

37. The rearview mirror assembly of claim 33, wherein said encapsulant defines an integral lens.

38. The rearview mirror assembly of claim 37, wherein said integral lens directs light from said LED chip at an angle relative to said flexible circuit board.

39. The rearview mirror assembly of claim 33 and further comprising a backing board secured to said second surface of said flexible circuit board.

40. A rearview mirror assembly for a vehicle comprising:
an electrochromic mirror having front and rear surfaces and first and second electrical connectors disposed along edges of said electrochromic mirror; and
a flexible circuit board disposed behind the rear surface of said electrochromic mirror and having a first surface facing the rear surface of said electrochromic mirror and a second surface opposite the first surface,
wherein said flexible circuit board includes printed electrical circuits that are terminated with connectors that provide an electrical connection with said electrical connectors of said electrochromic mirror, said printed electrical circuits extending to a common location on said flexible circuit board to provide mirror control terminals for connection to a source of a mirror control signal.

41. The rearview mirror assembly of claim 40, wherein said mirror control terminals include a pair of male contacts configured for engagement with corresponding female contacts in a connector plug that is connected to the source of the mirror control signal.

42. The rearview mirror assembly of claim 41, wherein said pair of male contacts includes a pair of lugs that are riveted to said flexible circuit board and extend outward from said second surface of said flexible circuit board.

43. The rearview mirror assembly of claim 40, wherein said flexible circuit board includes a resistive conductor extending back and forth across the first surface of said flexible circuit board to function as a mirror heater, said resistive conductor begins and ends at the common location to provide heater power terminals proximate the mirror control terminals.

44. The rearview mirror assembly of claim 43, wherein said mirror control terminals and said heater power terminals include male contacts configured for engagement with corresponding female contacts in a connector plug that is connected to the source of the mirror control signal and to a source of power for said mirror heater.

45. The rearview mirror assembly of claim 44, wherein said male contacts include lugs that are riveted to said flexible circuit board and extend outward from said second surface of said flexible circuit board.

46. The rearview mirror assembly of claim 43 and further including a turn indicator having at least one light source, wherein said flexible circuit board includes conductive paths extending therethrough from a location proximate said light source to the common location to provide turn indicator control terminals proximate said heater power terminals and said mirror control terminals, for connection to a source of a turn indicator control signal.

47. The rearview mirror assembly of claim 46, wherein said mirror control terminals, said heater power terminals, and said turn indicator control terminals include male contacts configured for engagement with corresponding female contacts in a connector plug that is connected to the source of the mirror control signal, the source of the turn indicator control signal, and to a source of power for said mirror heater.

48. The rearview mirror assembly of claim 47, wherein said male contacts include lugs that are riveted to said flexible circuit board and extend outward from said second surface of said flexible circuit board.

49. The rearview mirror assembly of claim 40 and further including a turn indicator having at least one light source, wherein said flexible circuit board includes conductive paths extending therethrough from a location proximate said light source to the common location to provide turn indicator control terminals proximate said mirror control terminals for connection to a source of a turn indicator control signal.

50. The rearview mirror assembly of claim 49, wherein said mirror control terminals and said turn indicator control terminals include male contacts configured for engagement with corresponding female contacts in a connector plug that is connected to the source of the mirror control signal and to the source of the turn indicator control signal.

51. The rearview mirror assembly of claim 50, wherein said male contacts include lugs that are riveted to said flexible circuit board and extend outward from said second surface of said flexible circuit board.

52. A rearview mirror assembly for a vehicle comprising:
a mirror having front and rear surfaces;
a flexible circuit board disposed behind the rear surface of said mirror and having a first surface facing the rear surface of said mirror and a second surface opposite the first surface; and
a turn indicator having at least one light source,
wherein said flexible circuit board includes a resistive conductor extending back and forth across the first surface of said flexible circuit board to function as a mirror heater, said resistive conductor begins and ends at a common location on said flexible circuit board to provide heater power terminals for connection to a source of heater power, and
wherein said flexible circuit board includes conductive paths extending therethrough from a location proximate said light source to the common location to provide turn indicator control terminals proximate said heater power terminals for connection to a source of a turn indicator control signal.

53. The rearview mirror assembly of claim 52, wherein said heater power terminals include male contacts configured for engagement with corresponding female contacts in a connector plug that is connected to the source of heater power.

54. The rearview mirror assembly of claim 53, wherein said male contacts include lugs that are riveted to said flexible circuit board and extend outward from said second surface of said flexible circuit board.

55. The rearview mirror assembly of claim 52, wherein said heater power terminals and said turn indicator control terminals include male contacts configured for engagement with corresponding female contacts in a connector plug that is connected to the source of heater power and to the source of the turn indicator control signal.

56. The rearview mirror assembly of claim 55, wherein said male contacts include lugs that are riveted to said flexible circuit board and extend outward from said second surface of said flexible circuit board.

57. A rearview mirror assembly for a vehicle, comprising:
a mirror having front and rear surfaces;
a flexible circuit board disposed behind the rear surface of said mirror and having a front surface facing the rear surface of said mirror and a rear surface opposite the front surface, wherein at least a portion of said flexible circuit board is disposed at an angle to said mirror; and
at least one light emitting device surface-mounted to the angled portion of said flexible circuit board so as to selectively project light through said mirror at an angle thereto.

58. The rearview mirror assembly of claim 57 and further comprising a carrier plate having an angled recess for holding said portion of said flexible circuit board at an angle relative to said mirror.

59. The rearview mirror assembly of claim 57, wherein said mirror is an electrochromic mirror.

60. The rearview mirror assembly of claim 57, wherein said at least one light emitting device includes a plurality of surface-mount LEDs.

61. A rearview mirror assembly for a vehicle, comprising:
a mirror having front and rear surfaces;
a first circuit board disposed behind the rear surface of said mirror and having a front surface facing the rear surface of said mirror and a rear surface opposite the front surface; and
a light module having at least one light source mounted to a second circuit board,
wherein said first circuit board includes a first plug connector extending from the rear surface thereof, and said second circuit board having a second plug connector extending from a front surface thereof for mating engagement with the first plug connector, said first circuit board includes conductive paths extending from said first plug connector to another location to which wiring from the vehicle is coupled to provide lamp module activation signals.

62. The rearview mirror of claim 61, wherein said first circuit board includes a third plug connector for mating connection with a corresponding plug connector attached to the vehicle wiring, said third plug connector being coupled by said conductive paths to said first plug connector.

63. The rearview mirror assembly of claim 62, wherein said first circuit board includes a mirror heater disposed on the front surface thereof, said mirror heater being electrically coupled to said third plug connector for receipt from the vehicle wiring of a heater power signal.

64. The rearview mirror assembly of claim 63, wherein said mirror is an electrochromic mirror having front and rear surfaces and first and second electrical connectors disposed along edges of said electrochromic mirror, wherein said first circuit board includes printed electrical circuits that are terminated with connectors that provide an electrical connection with said electrical connectors of said electrochromic mirror, said printed electrical circuits extending to said third plug connector for connection to a source of a mirror control signal.

65. The rearview mirror assembly of claim 62, wherein said mirror is an electrochromic mirror having front and rear surfaces and first and second electrical connectors disposed along edges of said electrochromic mirror, wherein said first circuit board includes printed electrical circuits that are terminated with connectors that provide an electrical connection with said electrical connectors of said electrochromic mirror, said printed electrical circuits extending to said third plug connector for connection to a source of a mirror control signal.

66. The rearview mirror assembly of claim 61, wherein said first circuit board is a flexible circuit board.

* * * * *